United States Patent
Reynolds et al.

(10) Patent No.: US 9,331,132 B2
(45) Date of Patent: May 3, 2016

(54) MULTIPLE CONDUCTIVE LAYER TFT

(75) Inventors: Kieran Reynolds, Histon (GB);
Catherine Ramsdale, Histon (GB);
Kevin Jacobs, Burwell (GB); William Reeves, Willingham (GB)

(73) Assignee: FLEXENABLE LIMITED, Cambridge, Cambridgeshire (GB)

( * ) Notice: Subject to any disclaimer, the term of this patent is extended or adjusted under 35 U.S.C. 154(b) by 1134 days.

(21) Appl. No.: 11/910,733

(22) PCT Filed: Apr. 5, 2006

(86) PCT No.: PCT/GB2006/050078
§ 371 (c)(1),
(2), (4) Date: Jul. 28, 2008

(87) PCT Pub. No.: WO2006/106365
PCT Pub. Date: Oct. 12, 2006

(65) Prior Publication Data
US 2009/0065767 A1 Mar. 12, 2009

(30) Foreign Application Priority Data

Apr. 5, 2005 (GB) .................................. 0506899.4
Jun. 1, 2005 (GB) .................................. 0511117.4

(51) Int. Cl.
*H01L 29/08* (2006.01)
*H01L 27/32* (2006.01)

(52) U.S. Cl.
CPC ........ *H01L 27/3262* (2013.01); *H01L 27/3265* (2013.01)

(58) Field of Classification Search
CPC .................. H01L 27/3265; H01L 27/3262
USPC .......... 257/59, 72, E33.064; 349/43, 44, 139, 349/147
See application file for complete search history.

(56) References Cited

U.S. PATENT DOCUMENTS 5,583,359 A * 12/1996 Ng et al. .................. 257/306
6,137,552 A    10/2000 Yanai
(Continued)

FOREIGN PATENT DOCUMENTS

EP    0849721 A    6/1998
EP    1 052 701 A2 11/2000
(Continued)

OTHER PUBLICATIONS

Office Action issued on May 26, 2014 for European Application No. 06 727 174.0-1552.
(Continued)

*Primary Examiner* — Vongsavanh Sengdara
(74) *Attorney, Agent, or Firm* — Knobbe Martens Olson & Bear LLP (57) ABSTRACT

A multiple layer pixel architecture for an active matrix display is provided in which a common bus line is formed on a metal level which is separate from that on which the gate electrodes of the thin-film transistors (TFTS) are formed. A multilayer electronic structure adapted to solution deposition, the structure includes a TFT for driving a pixel of an active matrix optoelectronic device and a capacitor for storing charge to maintain an electrical state of said active matrix pixel, wherein the structure includes a substrate bearing at least four conducting layers separeted by at least three dielectric layers, first and second ones of said conducting layers defining drain/source electrodes and a gate electrode of said transistor respectively, and third and fourth ones of said conducting layers defining respective first and second plates of said capacitor, and wherein said capacitor and said transistor are laterally positioned such that they overlap in a vertical direction.

15 Claims, 7 Drawing Sheets

(56) References Cited

U.S. PATENT DOCUMENTS

| | | | |
|---|---|---|---|
| 6,326,641 | B1 | 12/2001 | Choi |
| 6,395,586 | B1 | 5/2002 | Huang et al. |
| 6,498,369 | B1* | 12/2002 | Yamazaki et al. ............ 257/347 |
| 6,576,924 | B1 | 6/2003 | Yamazaki et al. |
| 6,590,227 | B2 | 7/2003 | Ishikawa |
| 6,628,358 | B1* | 9/2003 | Colson ........................ 349/114 |
| 6,781,153 | B2* | 8/2004 | Anzai ............................ 257/59 |
| 6,972,432 | B1* | 12/2005 | Furuya ........................ 257/59 |
| 7,015,503 | B2* | 3/2006 | Seki et al. .................... 257/40 |
| 7,365,393 | B2* | 4/2008 | Yamazaki et al. ............ 257/344 |
| 7,435,992 | B2* | 10/2008 | Choi et al. .................... 257/72 |
| 7,505,091 | B2* | 3/2009 | Hirakata et al. .............. 349/38 |
| 7,554,619 | B2* | 6/2009 | Lee et al. ...................... 349/39 |
| 8,174,634 | B2 | 5/2012 | Sirringhaus et al. |
| 2001/0005019 | A1 | 6/2001 | Ishikawa |
| 2002/0047154 | A1* | 4/2002 | Sowlati et al. ................ 257/307 |
| 2002/0097363 | A1* | 7/2002 | Yudasaka .................... 349/138 |
| 2002/0104995 | A1* | 8/2002 | Yamazaki et al. ............ 257/72 |
| 2003/0052336 | A1* | 3/2003 | Yamazaki et al. ............ 257/200 |
| 2003/0089940 | A1* | 5/2003 | Baker et al. .................. 257/309 |
| 2003/0089941 | A1* | 5/2003 | Baker et al. .................. 257/309 |
| 2003/0197179 | A1* | 10/2003 | Yamazaki et al. ............ 257/59 |
| 2004/0012548 | A1 | 1/2004 | Anzai |
| 2004/0051100 | A1* | 3/2004 | Yamazaki et al. ............ 257/59 |
| 2004/0113545 | A1* | 6/2004 | Pang et al. .................... 313/504 |
| 2004/0119399 | A1 | 6/2004 | Nagayama |
| 2004/0174349 | A1* | 9/2004 | Libsch et al. ................ 345/204 |
| 2004/0239614 | A1* | 12/2004 | Amundson et al. .......... 345/107 |
| 2005/0007494 | A1* | 1/2005 | Yamazaki et al. ............ 348/552 |
| 2005/0007535 | A1* | 1/2005 | Hirakata et al. .............. 349/141 |
| 2005/0012102 | A1* | 1/2005 | Izumi .............................. 257/72 |
| 2005/0040401 | A1* | 2/2005 | Yamazaki et al. ............ 257/72 |
| 2005/0087744 | A1* | 4/2005 | Koo et al. .................... 257/72 |
| 2005/0104814 | A1* | 5/2005 | Choi et al. .................... 345/76 |
| 2005/0186359 | A1* | 8/2005 | Ishizuka et al. .............. 428/1.1 |
| 2005/0218791 | A1* | 10/2005 | Kawase ........................ 313/500 |
| 2006/0033169 | A1* | 2/2006 | Hotta ............................ 257/392 |
| 2006/0054983 | A1* | 3/2006 | Acar et al. .................... 257/415 |
| 2006/0119754 | A1* | 6/2006 | Hirakata et al. .............. 349/38 |
| 2006/0131564 | A1* | 6/2006 | Shukla et al. ................ 257/40 |
| 2007/0013820 | A1* | 1/2007 | Jeoung ........................ 349/38 |
| 2007/0035677 | A1* | 2/2007 | Yamazaki et al. ............ 349/43 |
| 2007/0108480 | A1* | 5/2007 | Nanai et al. .................. 257/288 |
| 2007/0200113 | A1* | 8/2007 | Yamazaki et al. ............ 257/72 |
| 2008/0174710 | A1* | 7/2008 | Murakami et al. .......... 349/43 |
| 2008/0217624 | A1* | 9/2008 | Kwak et al. .................. 257/71 |
| 2009/0009094 | A1* | 1/2009 | Choi et al. .................... 315/169.3 |
| 2009/0014724 | A1* | 1/2009 | Yamazaki et al. ............ 257/59 |
| 2009/0153779 | A1* | 6/2009 | Yoshida et al. .............. 349/65 |
| 2009/0212292 | A1 | 8/2009 | Hayton et al. |
| 2009/0224251 | A1* | 9/2009 | Hotta ............................ 257/66 |

FOREIGN PATENT DOCUMENTS

| | | |
|---|---|---|
| WO | WO 99/10939 | 3/1999 |
| WO | WO 01/47043 | 6/2001 |
| WO | WO 01/47045 | 6/2001 |
| WO | WO 2004-070466 | 8/2004 |

OTHER PUBLICATIONS

International Preliminary Report on Patentability issued on May 20, 2014 for International Application No. PCT/GB2006/050078.

E.A. Huitema et al., Plastic transistors in active-matrix displays, Nature, 414, 599 (2001).

S. Burns et al., Inkjet printed polymer thin film transistors for active-matrix display applications, SID 2002 symposium, Digest of Technical Papers, 33, 1193-1195 (2002).

J.A. Rogers et al., Low-voltage 0.1 µm organic transistors and complementary inverter circuits fabricated with a low-cost form of near-field photolithography, Appl. Phys. Lett., 75, 1010-1012 (1999).

S. Brittain et al., Soft lithography and microfabrication, Physics World, May 1998, p. 31.

Z. Bao et al., High-performance plastic transistors fabricated by printing techniques, Chem. Mat., 9, 1299-1301 (1997).

H.E. Katz, Organic molecular solids as thin film transistor semiconductors, J. Mater. Chem., 7, 369-376 (1997).

Z. Bao, Materials and fabrication needs for low-cost organic transistor circuits, Adv. Mater., 12, 227-230 (2000).

J.G. Laquindanum et al., Synthesis, morphology, and field-effect mobility of anthradithiophenes, J. Am, Chem. Soc., 120, 664-672 (1998).

C.R. Kagan et al., Organic-inorganic hybrid materials as semiconducting channels in thin-film field-effect transistors, Science, 286, 945-947 (1999).

B.A. Ridley et al., All-inorganic field effect transistors fabricated by printing, Science, 286, 746-749 (1999).

Search Report dated Sep. 2, 2005 in corresponding application No. GB 0511117.4.

* cited by examiner

MULTIPLE CONDUCTIVE LAYER TFT

CROSS-REFERENCE TO RELATED APPLICATIONS

This application is the U.S. National Phase under 35 U.S.C. §371 of International Application No. PCT/GB2006/050078, filed Apr. 5, 2006, designating the United States and published in English on Oct. 12, 2006, as WO 2006/106365, which claims priority to United Kingdom Application No. 0511117.4, filed Jun. 1, 2005 and United Kingdom Application No. 0506899.4, filed Apr. 5, 2005.

FIELD OF THE INVENTION

The present invention relates to a multiple layer thin film transistor (TFT) structure for use for an active matrix polymer TFT display fabricated using techniques such as solution processing and direct printing.

DESCRIPTION OF RELATED ART

In accordance with the prior art, multi-layer active matrix displays are well known. Conventional thin film transistors (TFT) are typically fabricated with inorganic silicon, such as amorphous silicon or polycrystalline silicon. Silicon based processes require a combination of vacuum deposition and subtractive photolithographic patterning steps leading to high capital equipment, materials and manufacturing costs. The most common active matrix display technology is the thin film transistor liquid crystal display (LCD, where applications range from PDA and notebook devices to flat screen televisions. Active matrix displays are also used in combination with emerging display effects such as organic light emitting diodes (OLED) and electronic paper (electrophoretic materials).

In order to reduce manufacturing costs and to enable active matrix displays on flexible, plastic substrates printing-based approaches to manufacturing of TFTs have been developed. Graphic arts printing techniques such as inkjet printing, offset printing, screen printing, or flexographic printing have been adapted for deposition and patterning of electroactive TFT materials. Direct-write printing techniques are compatible with materials which can be solution-processed at low substrate temperatures, such as conjugated organic semiconductors, and enable maintaining a high registration over large areas even if the substrate exhibits significant mechanical distortion in between patterning steps. Solution based print processes are also environmentally friendly, cost effective and advantageous for short run length and large display sizes.

However, when using printing processes such as inkjet printing, screen printing and offset printing, it is difficult to fabricate metallic interconnect lines with a width of less than 50-100 μm because of the difficulties associated with delivering small volumes of liquid. This problem can be alleviated somewhat by printing onto a substrate with a pre-defined surface energy pattern as disclosed in PCT/GB00/04934. However, even using this technique, achieving linewidths of less than 10-20 μm can be challenging. Furthermore, many printable conductors such as conducting polymers or colloidal metals have conductivities significantly lower than bulk copper or silver, therefore requiring thick and wide interconnect lines to achieve adequate conductance across a large active matrix. In a conventional pixel architecture for an active matrix application, where the data line, the source and drain electrode of the TFT, the pixel electrode and the pixel capacitor are all defined in the same layer of the device, and compete with each other for space, the limited printing resolution reduces the achievable aperture ratio and front-of-screen performance of the display.

Semiconducting conjugated polymer thin-film transistors (TFTs) have been used to create a 4096 active matrix pixel display with 256 grey levels (E. A. Huitema et al., Nature 414, 599 (2001)). Semiconducting polymers in solution based print processes have more recently been used to create active matrix displays with printed polymer thin film transistors (S. Burns, et al. SID 2002 symposium, Digest of Technical Papers 33, 1193 (2002)).

In many conventional pixel configurations the presence of the pixel capacitor reduces the aperture ratio. In a conventional display the silicon TFT source-drain electrodes, addressing lines and the pixel electrodes are on one metal level of the device, and the gate electrodes and gate addressing lines are on a second metal level of the device.

In a reflective display with a bottom-gate transistor configuration where the pixel electrode also acts as the reflective mirror, the counter electrode of the pixel capacitor and the gate addressing line on the first level can be "hidden" behind the pixel electrode, but the data line, and the TFT channel are on the same metal level as the pixel electrode and this results in a reduction of the aperture ratio. However, U.S. Pat. No. 6,326,641 reports an increase in aperture ratio for a reflective type LC display with a non-transparent material. This is as a result of a gate line that preferably incorporates an L-shape gate electrode. This structure consists of a first and second storage capacitor; the second storage capacitor having substantially the same width as the gate line. The electric field by the gate line is blocked by the second storage capacitor electrode, thus having the additional advantage of reducing flicker by cross-talk. For a top-gate transistor configuration (where the level of the TFT gate is in between the pixel electrode and the display element) the reduction of aperture ratio tends to be even more significant. The areas of the gate interconnect lines and the capacitor counter electrode needs to be shielded from the viewer, as the electrical signals on these lines induce undesirable optical contrast of the display element.

In a transmissive display the aperture ratio restrictions are even harder to counteract. This is caused by the fact that most inorganic metallic conductors, with the exception of indium tin oxide, are not sufficiently transparent.

In our patent number PCT/GB00/04942 (WO 01/47045) a TFT device configuration is disclosed in which a pixel electrode is formed on a separate, third metal level, and an electrical contact is made to the drain electrode of the transistor using a via-hole interconnection. This configuration in which the data line, the TFT source-drain electrodes and the pixel capacitor are formed on a different metal level than the pixel electrode allows the pixel electrode to cover nearly 100% of the pixel area.

In our patent number PCT/GB2004/000433 (WO 2004/070466) a method is provided for producing a thin film transistor device incorporating an architecture which results in a high aperture ratio and allowing for an increase in the size of the pixel capacitor. This structure is achieved by the formation of a three layer device structure, incorporating source and drain electrodes on the first level, a gate electrode on the second level of the device and a top pixel on the third level. The elements of the device are formed by methods of solution processing and direct printing.

Figure 1A:
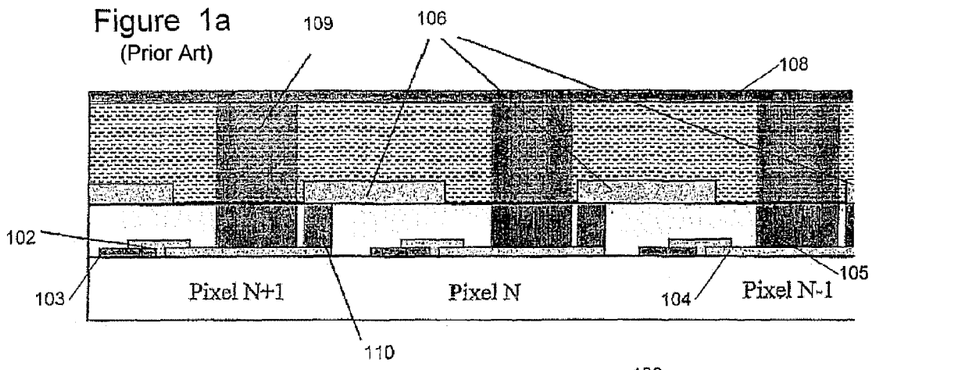
FIG. 1 illustrates a known multi-layer transistor structure and circuit
Figure 1B:
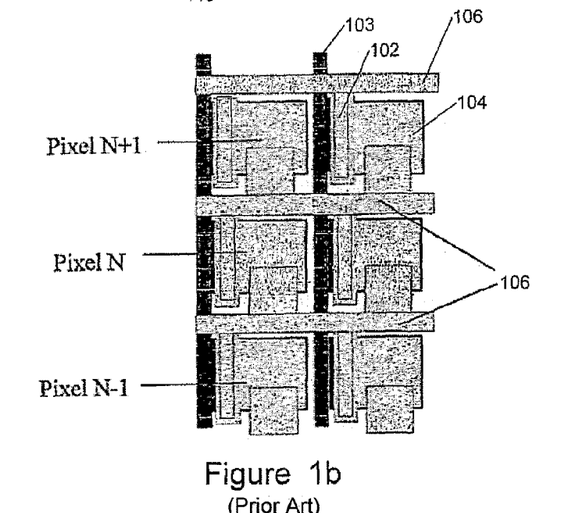
Figure 1C:
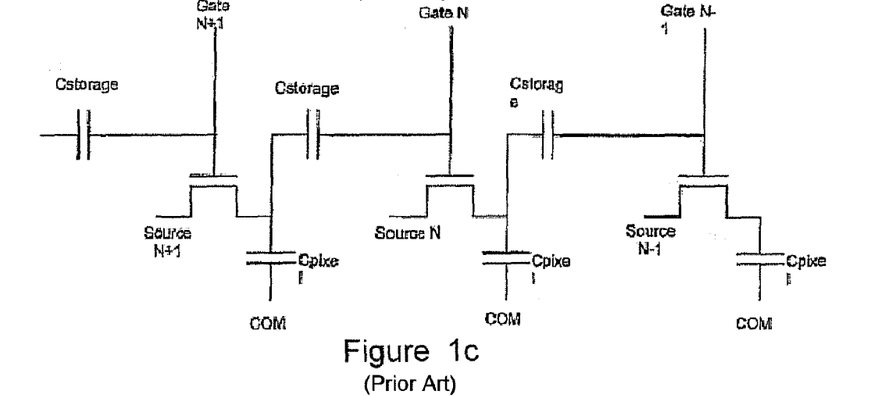

FIGS. 1a to 1c, which are taken from WO2004/070466, show an active matrix pixel where the display media is voltage controlled, such as liquid crystal or electronic paper. FIG. 1a is a side view of a transistor-controlled display device including a pixel capacitor. It has a substrate 101, a semiconductor 102, which may be a continuous layer or may be patterned, (in FIG. 1, the semiconductor is patterned in order to cover the transistor channel), a data line 103, a pixel electrode 104, a transistor dielectric 105, a gate electrode/gate interconnect 106 and a display media 107 (for example liquid crystal or electronic paper and a counter electrode 108 of the display media. In such a system the state of the display media is determined by the electric field across the media, which is a function of the voltage difference between the pixel electrode 104 and the counter electrode 108. A switchable area of the device 109 can be switched by a voltage difference between the pixel 104 and the top electrode 108. This area determines the aperture ratio of the device. FIG. 1b is a top view of the device and shows six transistors and six pixels arranged in three rows.

In an active matrix array, the lines are written sequentially. In order to maintain an image, the voltage written to one line should remain relatively constant during the addressing of the other lines. This is particularly true of greyscale devices. In voltage controlled devices such as liquid crystal or electronic paper, the pixel acts as a parallel plate capacitor providing a reservoir of charge. This capacitance can be augmented by the inclusion of a storage capacitor. A storage capacitor can be formed by overlapping the pixel with the gate line of the neighbouring transistor. FIG. 1 shows a case where the drain electrode is the pixel electrode, and is a schematic diagram of three adjacent pixels, N=1, N and N+1 of a top gate device. The gate/gate interconnects 106 are extended to overlap part of the adjacent pixel. A capacitor 110 is formed between pixel N and the gate of pixel N−1. The resultant storage capacitor helps the pixel to maintain a constant voltage throughout the cycle. However, in this case, this overlap of the adjacent gate interconnect over the lower, drain (pixel) electrode leads to a reduction of the switchable area 109 of the device and therefore, the aperture ratio.

FIG. 1c shows the circuit diagram for this arrangement, where the storage capacitor, $C_{storage}$, is formed between the pixel electrode 104 and the gate of a pixel of a neighbouring transistor. This capacitor acts as a reservoir for charge and therefore enhances the image holding ability of the pixel.

An advantage of forming a multi-layer structure is that it allows a larger area of the individual thin film transistor (TFT) footprint to be used for the TFT without compromising the aperture ratio. This allows for larger TFT structures to be used and sufficient performance to be obtained even with TFTs with low field-effect mobility. This would not be possible for structures that incorporate all of the elements of a transistor, such as a source and drain electrodes, source data line and a pixel capacitor on the same metal level as the pixel electrode.

Active matrix displays, where the pixel voltage or current is controlled by one or more transistors, dominate flat panel display design. One of the key elements of an active matrix display pixel is the pixel capacitor, formed between each of the pixel electrodes and an interconnect line at a fixed potential. The interconnect line can be a separate metallic line held at a fixed potential (usually ground potential) during the addressing of the active matrix, or it can be the (N−1)th or (N+1)th neighbouring TFT gate addressing line, that is kept at a fixed potential while the Nth gate addressing line is being addressed. This configuration is most common because it does not require a third additional set of interconnect lines running across the display, as would be the case where there is a separate bus line.

Pixel capacitors are used to maintain the charge on a pixel in an active matrix display while the rest of the display is being addressed. It acts as a reservoir of charge against the leakage current or off current, back through the transistor when the TFT is off. However, it is important not to increase this storage capacitance at the expense of the switchable area and the resulting aperture ratio. The aperture ratio is defined as the switchable or active area of the pixel (or sub-pixel) divided by the total area dedicated to one pixel, and may be expressed as a percentage of the total area. The greater the aperture ratio, the higher the front-of-screen performance. The pixel electrode is enlarged to its maximum in the device reported in U.S. Pat. No. 6,137,552, to give a high aperture ratio leading to a bright display. U.S. Pat. No. 6,395,586 uses a method for forming the device, by directly depositing the source/drain metal layer on an n-type amorphous silicon layer before patterning the silicon layer. An organic polymeric layer is then deposited on top of the TFT structure to produce a device of high aperture ratio and low contact resistance. However, it is often a problem within the prior art that the size of the capacitor structure is limited as it competes for space within the device, with the TFT structure and the via pad.

Pixel capacitors also help to reduce the so-called kickback voltage, which arises due to parasitic gate-to-source/drain capacitance of the TFT. When the gate voltage is switched from its ON value to its OFF value at the end of the pixel charging cycle, the pixel voltage tends to follow the switching of the gate voltage and changes by an amount $\Delta V_p$. This effect is undesirable, and can be reduced for a given TFT design by increasing the value of the pixel capacitance. Pixel capacitors are frequently used in conventional liquid crystal displays and other voltage controlled display effects.

Pixel capacitors are particularly important when used in conjunction with ticker display media such as electronic paper where the thickness of the display effect, such as an electrophoretic media, leads to a lower capacitance of the display element itself. In these displays the pixel capacitor can take up a significant fraction of the pixel, in particular in situations where the kickback effect is large.

The manufacture of active matrix displays by solution based print processes, as described herein, offers many potential advantages over conventional manufacturing methods. In principle, solution based print processes are environmentally friendly, low temperature, compatible with flexible substrates, cost effective and advantageous for short run length and large display sizes. When using printing processes such as inkjet printing, screen printing and offset printing, it is difficult to fabricate metallic interconnect lines with a width of less than 50-100 µm because of the difficulties associated with delivering small volumes of liquid. This problem can be alleviated somewhat by printing onto a substrate with a predefined surface energy pattern as disclosed in our PCT/GB00/04934 (WO 01/47043). However, even using this technique, achieving linewidths of less than 10-20 µm can be challenging. Furthermore, many printable conductors such as conducting polymers or colloidal metals have conductivities significantly lower than bulk copper or silver, therefore requiring thick and wide interconnect lines to achieve adequate conductance across a large active matrix. Therefore, by using conventional display architectures, printed electrode and printed pixel capacitors tend to be large and result in active matrix displays with low aperture ratios.

The present invention relates to an improved multiple layer thin film transistor (TFT) structure for use for an active matrix polymer TFT display by addressing limitations of the prior art arrangements, such as the distortion of flexible substrates and low capacitance resulting in insufficient device performance.

SUMMARY OF THE INVENTION

According to a first aspect of this invention there is therefore provided a multilayer electronic structure adapted to/fabricated by solution deposition, the structure including a thin film transistor (TFT) for driving a pixel of an active matrix optoelectronic device and a capacitor for storing charge to maintain an electrical state of said active matrix pixel, wherein the structure comprises a substrate bearing at least four conducting layers separated by at least three dielectric layers, first and second ones of said conducting layers defining drain/source electrodes and a gate electrode of said transistor respectively, and third and fourth ones of said conducting layers defining respective first and second plates of said capacitor, and wherein said capacitor and said transistor are laterally positioned such that they overlap in a vertical direction.

In embodiments by arranging the gate electrode of the thin film transistor in a separate conducting layer to the first (counter) plate of the capacitor increased alignment tolerance is obtained since by using separate conducting layers more (lateral) space is made available for the gate electrode and counter plate features facilitating lateral alignment of features in different conducting layers.

This arrangement facilitates the provision of a relatively large capacitance where needed without the need to significantly encroach on the aperture ratio when the structure is incorporated into a pixel structure of an active matrix electroluminescent display. Preferably the capacitor is substantially directly above the transistor. The structure is particularly suitable for solution deposition techniques, in particular direct write techniques in which at least some of the layers comprise organic, in particular polymer material such as polymer semiconducting and/or conducting material (here references to organic including organometallic materials).

In some preferred embodiments one or both of the third and fourth conducting layers are substantially transparent in a visible region of the spectrum, more particularly at a wavelength at which the (electroluminescent material) of the active matrix display is designed to operate. This may be achieved by the use of very thin layers and/or layers of transparent conductor such as indium tin oxide or PEDOT. When incorporated into a pixel drive structure of an active matrix display preferably one of the third and fourth conducting layers is used for fabricating a common bus line of the display, for example an interconnect line to be held at a fixed potential such as ground or an address line such as the gate addressing line of a neighbouring thin film transistor. Preferably the other plate of the capacitor forms a pixel drive electrode for applying a voltage/current to the electroluminescent material. This structure helps to provide an enhanced aperture ratio and also provides some alignment tolerance between the various layers of the structure.

Preferably the plate of the capacitor providing the interconnect covers at least half the area of the pixel electrode footprint, to provide enhanced capacitance and preferably the (common bus) interconnect itself comprises the first plate of the capacitor by fabricating the interconnect with sufficient width to provide the desired capacitance. Preferably the structure includes a via connecting a source and/or drain electrode of the transistor to the pixel electrode, that is to one plate of the capacitor. Preferably the one or more conducting layers which are not to be connected to this via (the gate electrode layer and the other plate of the capacitor) are patterned to avoid the via, although in other embodiments a via formation process may be employed which renders substantially insulating an edge of a conducting layer through which it passes. In this way, for example, the third conducting layer may be unpatterned.

In some preferred embodiments the structure includes an additional conducting layer and an additional dielectric layer between the second conducting layer and the third conducting layer. These are preferably connected to form a third plate of the capacitor, for example by connecting this additional conducting layer to the fourth conducting layer, in particular to the pixel electrode plate of the capacitor. This may be achieved by means of a via, for convenience the same via (or other interconnect) which connects the pixel electrode to the source or drain electrode of the transistor.

In some preferred embodiments the capacitance between the first and third plates of the capacitor (that is the capacitance provided by the additional conducting layer) is greater than that between the first and second plate of the capacitor—or at least the layer of dielectric between the first and second plate is thicker than that between the first and third plates. This facilitates patterning of the upper pixel electrode. Preferably the first, second, third and fourth conducting layers are in order of increasing distance from the substrate—that is preferably the first conducting layer is closest to the substrate and the fourth conducting layer is the furtherest (vertically) of layers from the substrate. However a different order of conducting layers may also be employed—for example in our WO 2004/07066 an example of a bottom gate device is described.

It will be appreciated that in the above description, references to a pixel include a sub-pixel of a colour display.

In a related aspect of the invention there is provided a method of fabricating a multilayer electronic structure on a substrate, the structure including a thin film transistor (TFT) for driving a pixel of an active matrix optoelectronic device and a capacitor for storing charge to maintain an electrical state of said active matrix pixel, the method comprising: depositing and patterning a first conducting layer over said substrate to define source and drain electrodes of said thin film transistor; depositing an organic semiconducting layer over said first conducting layer; depositing a first dielectric layer over said organic semiconducting layer; depositing and patterning a second conducting layer over first dielectric layer to define a gate electrode for said thin film transistor; depositing a second dielectric layer over said second conducting layer; depositing and patterning a third conducting layer over said second dielectric layer to define a first plate of said capacitor; depositing and patterning a fourth conducting layer over said third dielectric layer to define a second plate of said capacitor; wherein said capacitor and said transistor are laterally positioned such that they overlap in a vertical direction; and wherein at least some of said deposition and patterning steps employ a solution processing technique.

The deposition and patterning of the conducting layers may be performed in separate stages or in a single, combined stage, for example by inkjet or other direct write printing techniques.

There is further provided a method of fabricating an active matrix display by using the above method to fabricate a driver structure for each pixel. In this way an aperture ratio of the display may be increased. Preferably in such a method the patterning of the third conducting layer further defines at least one bus line for the display, in particular an external interconnect such as a fixed potential or ground line or a date addressing line.

The invention further provides a multilayer electronic capacitor structure adapted to/fabricated by solution deposition, the capacitor structure comprising a substrate bearing a first conducting layer defining a first plate of said capacitor, a second conducting layer defining a second plate of said capacitor, and a first intermediate dielectric layer between said first and second capacitor plates; and wherein the structure further comprises a third conducting layer defining a third plate of said capacitor, said second and third plates being on opposite sides of said first plate, a second intermediate dielectric layer between said first and third capacitor plates, and an interconnect connecting said first and third plates.

Embodiments of this structure facilitate the provision of increased capacitance while reducing difficulties associated with thin dielectrics which can be encountered in structures fabricated using a solution processing technique, in particular difficulties associated with patterning a conducting layer without undue damage to one or more underlying layers.

The invention further provides a method of fabricating a multilayer electronic capacitor structure comprising depositing and patterning three conducting layers interleaved with patterned electric layers (at least one between each pair of conducting layers) using a solution deposition technique, to define a capacitor comprising a first plate sandwiched between second and third plates on opposite sides of the first plate, and then electrically connecting the second and third plates.

The invention further provides a multiple layer pixel structure for an active matrix display, the pixel structure defining an organic thin film transistor and an associated capacitor on a substrate, wherein one plate of said capacitor is defined in a first metal layer which includes a bus line of said display, and wherein a gate electrode of said thin film transistor is defined in a second metal layer different to said first metal layer.

In embodiments of all the above described structures and methods the substrate may comprise a flexible substrate, for example a plastic substrate.

The invention further provides a pixel interface circuit for an active matrix optoelectronic device, the circuit including a thin film transistor configured to connect to an electrode for interfacing with an optoelectronic pixel of the device, and a capacitor coupled to said transistor for storing charge to maintain an interface signal for said electrode; wherein said capacitor comprises three plates, a first plate being located between second and third plates of said capacitor, and wherein said second and third plates are connected together.

The optoelectronic device may comprise a display device, the TFT driving a pixel of the display and the capacitor maintaining a drive signal for the pixel; additionally or alternatively the optoelectronic device may comprise a sensor.

A first embodiment provides a multi-layer transistor structure (as described later with reference to FIG. 3), that incorporates a four layer device in which a common bus (COM) line forming a pixel capacitor with the pixel electrode is formed on a separate metal level of the pixel structure. The source data line, TFT source and drain electrodes and a via pad that is connected to the drain electrode, are patterned in a high resolution step onto a substrate. The semiconductor layer is deposited and patterned and this is followed by the deposition of the dielectric layers to form the first level of the device.

The gate electrode and interconnect lines are then deposited and patterned on top of level one. These layers preferably cover the source and drain electrode of the device to aid alignment (see our UK Patent Application No 0426563.3, filed 3 Dec. 2004 and applications claiming priority therefrom, but otherwise do not need to be registered to a high degree of accuracy to the features below. A further dielectric layer is then deposited over the gate interconnect line. This layer of dielectric material may be very thick and provides an efficient gate isolation layer.

Onto this layer a conductive COM layer is deposited to form level three of the device. The conductivity of this layer does not need to be particularly high. The COM layer is patterned in such a way the common lines do not overlap with the area of the via pad on the base layer. The COM layer is then coated with an additional dielectric material.

A via hole between a top layer of the device and the underlying layers described above, down to the base substrate layer is then formed connecting the via pad on the base layer to the top layer of the device. Onto this top layer, a pixel pad is defined and isolated. This pixel pad forms the second half of a capacitor with the aforementioned COM layer.

One of the advantages of such a four-metal-level pixel structure (and here "metal" includes an organic conductor) is that the dielectric material used to form the pixel capacitance can be optimized separately from the gate dielectric of the TFT. This structure also helps isolate and shield the pixel electrode from electrical signals travelling on the data and gate interconnects, which can lead to artifacts and degradation of the optical image.

A second embodiment provides a five-layer transistor device structure as described later with reference to FIG. 4). This structure incorporates a metal level separate from the pixel electrode for overlapping with the COM layer and forming the pixel capacitance. The capacitor layer is electrically connected to the respective pixel electrode through a via-hole interconnection. This five-layer structure allows a lower tolerance for the dielectric layer deposited above the COM layer, in particular its thickness, which can aid the isolation of the pixel pad above. The addition of both the dielectric layer above the capacitor level and the layer of dielectric material above the COM level may be used in the capacitor structure where there is a requirement a higher capacitance to be obtained. This structure allows multiple layers to be connected through one via hole. However, an additional via hole may be added if required to connect the capacitor layer of the device to the via pad. In this case, the via pad will be required to be larger in order to allow two via holes to be connected to it.

Where a 4-layer device structure is unable to meet the dielectric material requirements in order to achieve an increased capacitance, then a 5-layer device structure may be required. A 5-layer device structure may overcome technical problems encountered within a 4-layer device structure and increase the ease of processing the dielectric layers.

As it has been mentioned above, within a storage capacitor, the pixel dielectric layer is preferably sufficiently thin in order to provide sufficient storage capacitance to counter the undesirable overlap capacitance between the gate electrode and the drain electrode. Where this dielectric layer is required to be thinly deposited, a pin-hole effect may result, revealing the underlying layer, where regions of the dielectric layer have de-wetted from said underlying layer. Alternatively, where a rough underlying conductive layer is provided, a thicker dielectric layer may be required in order to fully cover this underlying layer and prevent the occurrence of shorts.

In addition, a 5-layer structure may be advantageous if problems become apparent in processing the dielectric material. If processing a thin layer of dielectric material appears to be problematic, for example, due to adhesion problems or problematic underlying layers, there can be a risk that underlying and overlying conductive layers short, as previously described. Whether a high yield thick layer or a thin dielectric layer is required, both of these cases will generally need thickness uniformity throughout the dielectric layer. Therefore, occasions may arise where the display media, for example, may require a higher storage capacitance than can be provided by the overlap of the COM and the pixel electrode than the processing constraints of the dielectric layer can accommodate.

The 5-layer structure facilitates the desired dielectric properties to be obtained over two layers that may not easily be obtained over a single layer within the 4-layer structure, in order to obtain the desired higher capacitance.

Compared to the three-layer pixel architecture disclosed in our PCT/GB2004/000433 (WO 2004/070466) embodiments of both the four-layer and the five-layer structures remove the need to pattern two high resolution sets of interconnect lines in the same plane, such as the gate interconnect lines to switch the TFT and the COM lines to provide a counter plate for the capacitor structure. For a given design rule of achievable linewidth, and minimum line spacing required this enhances the display resolution which is achievable with a given deposition and patterning technology. It also reduces the need for accurate alignment of upper layers with respect to features in lower layers, since larger features can be patterned in each layer and alignment tolerant structures can be used.

As an example of such an alignment-tolerant structure in the four-layer structure the pixel capacitor can be formed with one of the two electrodes being quasi-continuous, in which case the pixel capacitance then becomes largely insensitive to the detailed position of the other of the electrode. This can be achieved, for example, by running a straight COM line with a given linewidth smaller than the pixel pitch behind the pixel electrode. The correct pixel capacitance can be tuned by the capacitance (thickness and dielectric constant of the pixel capacitor dielectric). Even for a wide linewidth a small pixel capacitance can be achieved if needed by choosing a relatively thick pixel dielectric. In this structure the value of the pixel capacitance is independent of the exact location of the COM line behind the pixel electrode, as long as the COM line is fully running below the pixel electrode, and does not begin to overlap with the neighbouring pixel electrode. By choosing an appropriately thick dielectric between the COM line and the TFT layers, such that any contribution to the pixel capacitance from overlap of the COM line with the drain electrode of the TFT in the first layer is negligible, the value of the pixel capacitance can be made to be insensitive to the exact position of the COM lines. This leads to a highly uniform value of the pixel capacitance across the pixel array, which is an important requirement for greyscale displays.

A similar alignment-tolerant structure can be realized by forming a quasi-continuous COM layer (for example, excluding just the area around the via-hole pads) behind a patterned top pixel electrode.

Embodiments of the four and five layered structures according to the present invention reduce the need for highly accurate alignment to underlying layers and provides for techniques such as, but not limited to, inkjet printing, to use local registration to compensate for substrate distortion. In addition, they remove the need to have two conductive lines, the COM line over a capacitor structure and a further conductive line to drive the gate of the TFT, being deposited over the first dielectric layer (described below). These structures allow for these two conductive lines to be separated into different levels within the device.

The structures also allow different dielectric material to be used for the gate interconnect line of the TFT and the storage capacitor. Therefore, each dielectric layer can be optimized separately to meet the specific requirements, and values of the pixel capacitance can be set independent of the design rules for patterning the electrodes of the pixel capacitor. In addition, by patterning the electrodes on separate levels of the device the changes of debris-induced electrical shorts between electrodes are reduced. This is particularly relevant for high resolution active matrices.

BRIEF DESCRIPTION OF THE DRAWINGS

To help understanding of the invention, specific embodiments thereof will now be described by way of example and with reference to the accompanying drawings, in which.

DETAILED DESCRIPTION OF PREFERRED EMBODIMENTS

Figure 2:
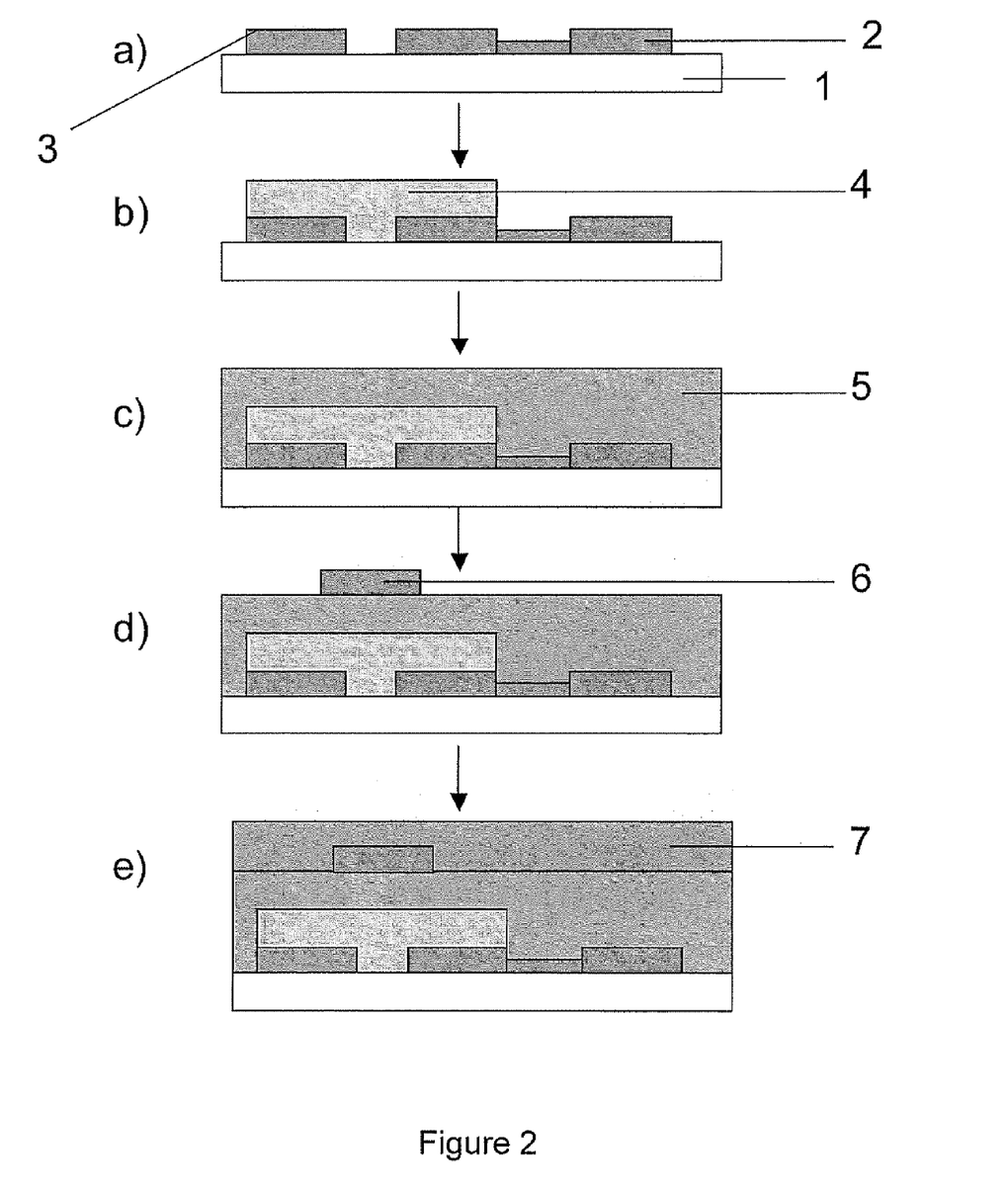
FIG. 2 shows a method of forming a transistor structure.
Figure 3:
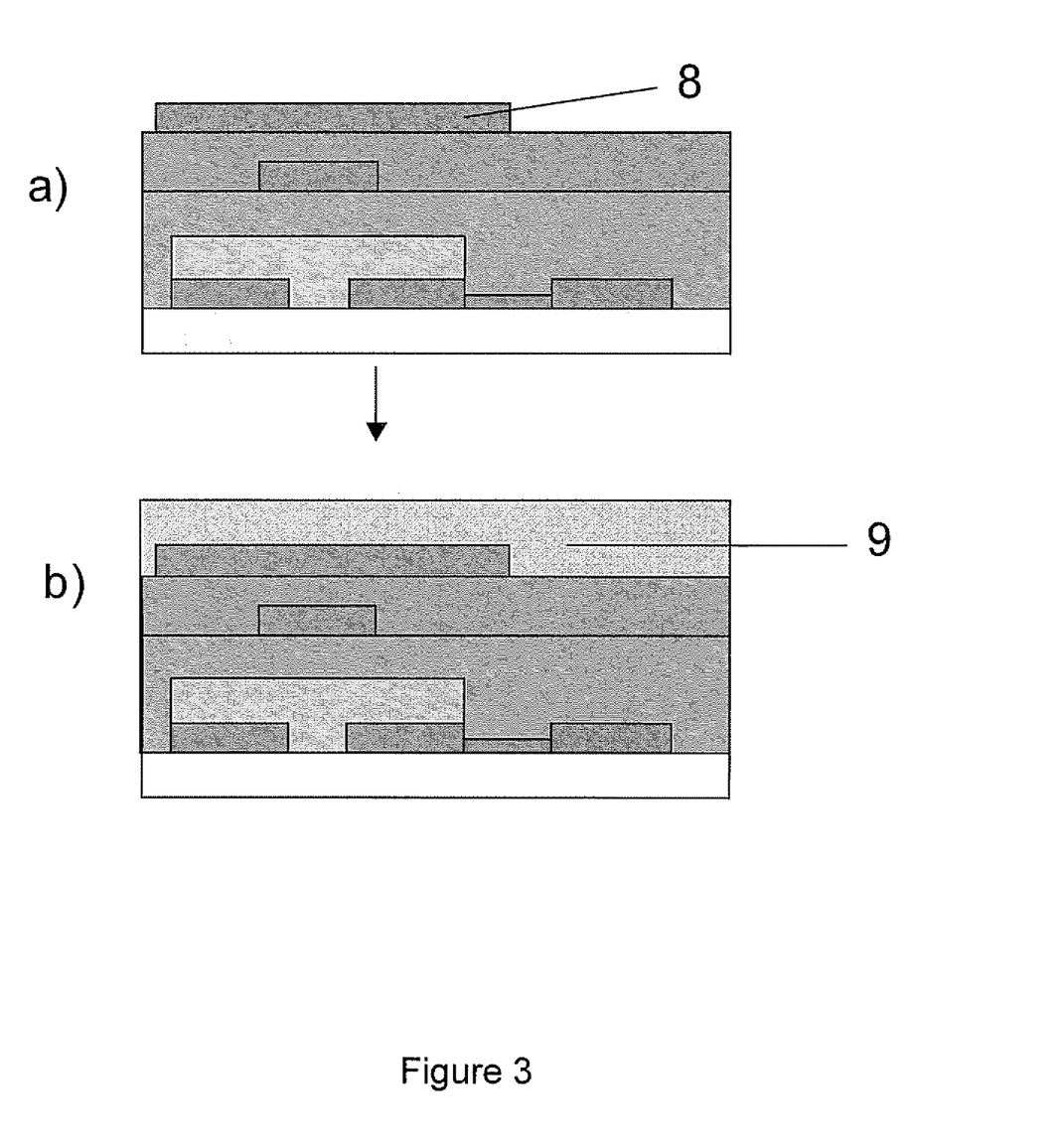
FIGS. 3a to 3e show a method of forming a multi-layer transistor and capacitor structure including a via hole through a four level structure, connecting a top pixel electrode and a via pad on a lower level of the device, and a cross-sectional view and a view from above of a resulting structure.

With reference to FIGS. 2 and 3, a first embodiment of the present invention is now described in detail. A substrate 1 is coated with a thin layer of conductive material. The substrate may be either glass or a polymer film. According to a preferred embodiment of the invention the substrate is a plastic substrate, such as a film of polyethyleneterephtalate (PET) or polyethylenenaphtalene (PEN). A first conductive layer 2, is preferably a metallic layer, and most preferably a layer of inorganic metal such as gold or silver; or any metal that adheres well to the substrate and is electrically compatible with the chosen semi-conductor may also be used, or any combination of metals to achieve these effects. A bilayer structure may be deposited, including a seed or adhesion layer in between the layer of metallic material and the substrate. Alternatively, a conductive polymer may be used, such as PEDOT/PSS. The conductive material is preferably deposited using solution processing techniques such as, but not limited to, spin, dip, blade, bar, slot-die, or spray coating, inkjet, gravure, offset or screen printing. An technique, such as, but not limited to an evaporation or sputtering process may also be used to deposit a metallic layer, but preferably a sputtering technique is used. The first conductive layer is generally patterned and may form, for example, the source and drain electrodes 3 or the gate electrode of a transistor device. The patterning may be achieved by a process such as, but not limited to, photolithography, laser ablation or direct-write printing. Other processes that may be used include shadow mask evaporation or other printing and etching methods.

Subsequently a sequence of further conducting, dielectric and semiconducting layers is deposited on top of the first conductive layer.

For example, in the case of a transistor device in top-gate configuration, once the metallic layer has been patterned to form source and drain electrodes 3, a layer of semiconducting material 4 is deposited over the substrate. The semiconducting material may be a semiconducting polymer such as a polytriarylamine, polyfluorene or polythiophene derivative. A broad range of printing techniques may be used to deposit the semiconducting material including, but not limited to, inkjet printing, soft lithographic printing (J. A. Rogers et al., Appl. Phys. Lett, 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, blade coating or dip coating, curtain coating, meniscus coating, spray coating, or extrusion coating, spin-coating onto the substrate. The typical thickness of the semiconducting layer is on the order of 50-100 µm after solvent evaporation. In addition, an evaporative process may also be used. A preferred technique is ink jet printing which can also pattern the semiconducting layer. If the layer is ink jet printed, a minimum amount of semiconductor material may be used, which is both environmentally and economically advantageous.

A layer of gate dielectric material 5 or a sequence of dielectric layers may then be deposited on top of the semiconducting layer. Materials such as polyisobutylene, polymethylmethacrylate, polystyrene or polyvinylphenol may be used. The dielectric material may be deposited in the form of a continuous layer, by techniques such as, but not limited to, spray or blade coating. However, preferably, the technique of spin coating is used. Preferably the semiconductor layer is patterned in order to prevent leakage current between adjacent devices. The typical thickness of the gate dielectric layer is between 150-1000 nm. The semiconductor layer/dielectric layer interface defines the device performance. The dielectric may either be a single layer or a sequence of multiple layers. According to one embodiment of the present invention the dielectric is a double-layer with a low-k dielectric in contact with the semiconducting layer, and a high-k material deposited on top. In addition, the dielectric layer(s) need to be chosen such as to allow the gate interconnect line to be deposited on top of the dielectric layer(s) with ease. This can be achieved by depositing a further dielectric layer on top of the high-k dielectric material acting as a wetting layer.

The deposition of the layer of dielectric material is then followed by the deposition of a gate interconnect line 6. The gate interconnect line may comprise conducting polymer, such as polyethylenedioxythiophene doped with polystyrene sulfonic acid (PEDOT/PSS). However, the gate electrode is preferably a metallic material of high conductivity, such as gold or copper, but most preferably, a printable liquid containing inorganic nanoparticles of silver or gold which may be deposited by a variety of means. The gate electrode is deposited and patterned using techniques such as sputtering or evaporation photolithography or deposited and patterned by solution processing techniques such as spin, dip, blade, bar, slot-die, gravure, offset or screen printing. Preferably, the gate electrode is deposited by ink jet printing. A gate electrode wetting layer, such as a layer of polyvinylphenol, maybe be deposited onto the substrate prior to the printing of the metal ink.

The conductivity of the gate interconnect line should be sufficiently high to drive the display. The deposited gate interconnect lines created by this process are generally required to undergo an annealing process to improve the conductivity or convert non-conductive inks to a conductive state. This annealing process is preferably carried out with an IR laser beam. However, depending on the ink that is used for the conductive layer, ultraviolet radiation or thermal annealing may also be used.

A top dielectric layer 7 is then added to the layered stack. Preferably, the top dielectric layer is an organic dielectric material or a layer of organic-inorganic hybrid dielectric material. The layer of dielectric material may, for example, be a layer of chemical vapour deposited parylene. Alternatively, a number of layers of dielectric material may be deposited at this stage, including layers of material such as solution coated polystyrene or PMMA. These layers of dielectric material may be coated by any large area coating method, such as, but not limited to, spin coating, spray coating, or blade coating. The thickness of the layer is preferably in the range of 0.1-20 µm, more preferably in the range of 1 to 12 µm and most preferably in the range of 5-10 µm.

This layer provides electrical isolation to prevent the COM layer and the gate interconnect lines shorting. This top dielectric layer should be thick enough to reduce any capacitive coupling between the gate interconnect line and the COM electrode or provide a suitable dielectric constant. The material of the dielectric layer may be modified to allow patterning by methods such as adding an IR absorbing chemical moiety to the material followed by laser ablation of the material. The dielectric layer may also be tuned or chosen such the it possesses adhesive properties that allow ready deposition of the overlying COM layer.

Figure 3E:
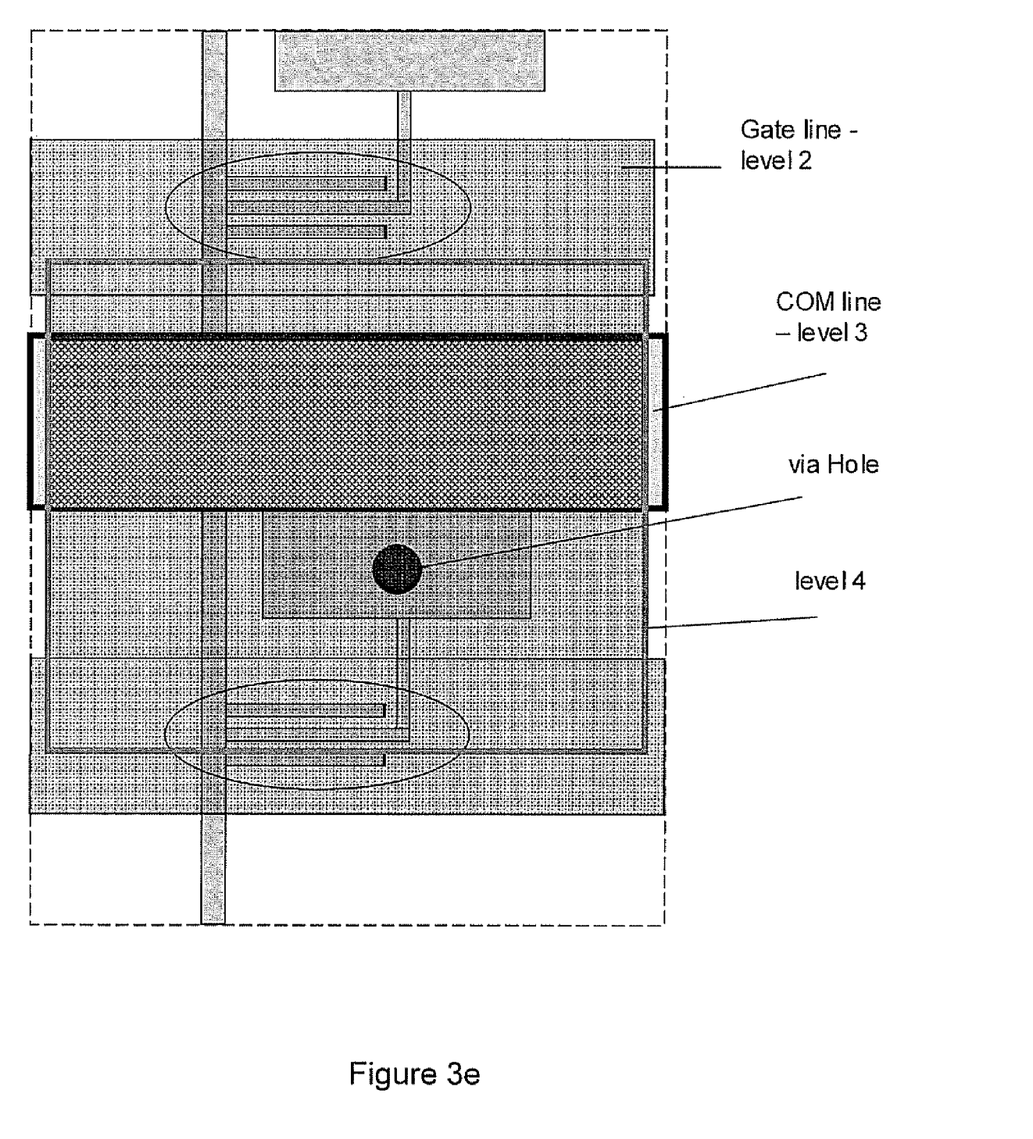

Referring now to FIG. 3, which continues FIG. 2, a common bus (COM) layer is now deposited. This conductive COM layer 8 should have sufficient conductivity to compensate for any swings in voltage as the gate interconnect line is switched. As seen in FIG. 3*d*, preferably neither the gate interconnect layer nor the COM layer are allowed to overlap with the area of the via-hole pad on the underlying source-drain level. The size of the area to be left uncovered is dependent on the size of the via hole and alignment ability. The alignment ability is dependent on the substrate distortion properties. The requirements for the positional accuracy of the COM line are significantly reduced with respect to the requirements of a 3 layer structure. The only desirable requirements are a consistent line width across the panel and the avoidance of the via hole area in the pixel electrode region, such as a 250 µm by 250 µm for a ~100 ppi, as seen in FIG. 3*e*, which shows a view from above of a portion of an active matrix display incorporating an embodiment of a structure according to the present invention.

We note that in situations, where the material for the COM electrode and the process for via-hole formation are chosen such that the via-process does not form an electrical connection between the pixel electrode and the COM layer even if the via went straight through the COM layer, the COM layer may even be unpatterned, i.e. could be deposited by a simple continuous coating step. This might be achieved by, for example, using a conducting polymer as COM electrode material, and using a via-hole formation process during which the exposed edge of the conducting polymer layer is rendered insulating, such as a laser ablation process in a reactive atmosphere, which causes surface de-doping of the conducting polymer at the exposed edge of the via hole.

A third dielectric layer 9 may then be deposited over the COM electrode layer. This layer is Generally required to be thin in order to provide a useful storage capacitance. The adhesive properties of this layer of dielectric material should also be such to allow the overlying top pixel electrode to be patterned on top. Again, the deposition of upper layers onto this dielectric layer is a consideration when choosing or tuning the dielectric material.

A via hole 10 is then formed through the layers of the device to connect the top layer of conductive material with a conductive via pad on the first layer of the device, therefore connecting the upper layer high aperture ratio pixel to the underlying drain electrode of the transistor. This connection allows the top pixel electrode to charge when the TFT is activated. The via hole is preferably formed using an excimer laser to drill through underlying polymer layers. However, other methods of forming the via hole known in the prior art include mechanically punching a via hole through the underlying layers or the method local solvent deposition (PCT/GB00/0494 ibid PCT/GB00/04942).

Finally, a top pixel electrode layer 11 is deposited over the layered substrate. For many applications this conductive layer need not to be particularly highly conductive. Therefore, preferably, a conductive polymer may be used, such as PEDOT/PSS. The conductive material is preferably deposited using solution processing techniques such as spin, dip, blade, bar, slot-die, or spray coating, inkjet, gravure, offset or screen printing. An evaporation process may also be used to deposit an inorganic metallic layer, but preferably a sputtering technique is used. If a coating method is chosen, then the pixel electrode may be patterned by a process such as, but not limited to, photolithography, laser ablation or direct-write printing. Other processes that may be used include shadow mask evaporation or other printing and etching methods. Additionally or alternatively, a method of surface energy patterning may be used to pattern the pixel electrode, such as modifying the dielectric material to control the spread of the drops of dielectric material to isolate the top pixel electrode. In addition, a method of ablation of a sputtered or evaporated metal layer with a pico-second laser may be performed. However, use of a sputtered or evaporated layer may require that the via holes are filled by a separate process as evaporation/sputtering methods may not connect all the required layers of the device.

If the patterning of the top pixel electrode is especially problematic, with the third dielectric layer characteristics and thickness being defined by the capacitance required, or if the capacitance is insufficient then a five layer structure can be formed. A capacitor conductive layer is then defined and isolated from its neighbours to form one half of a capacitor. A third dielectric layer is then deposited as is described below, the characteristics of which are chosen to provide high capacitance. Onto this dielectric layer a COM layer is patterned (as above), defining the second half of the capacitor, and a final dielectric layer deposited on top. A via hole is added to the structure, connecting the top conductive layer, the pixel layer to the via pad on the lower level. Finally, a pixel pad is defined and isolated.

Figure 4:
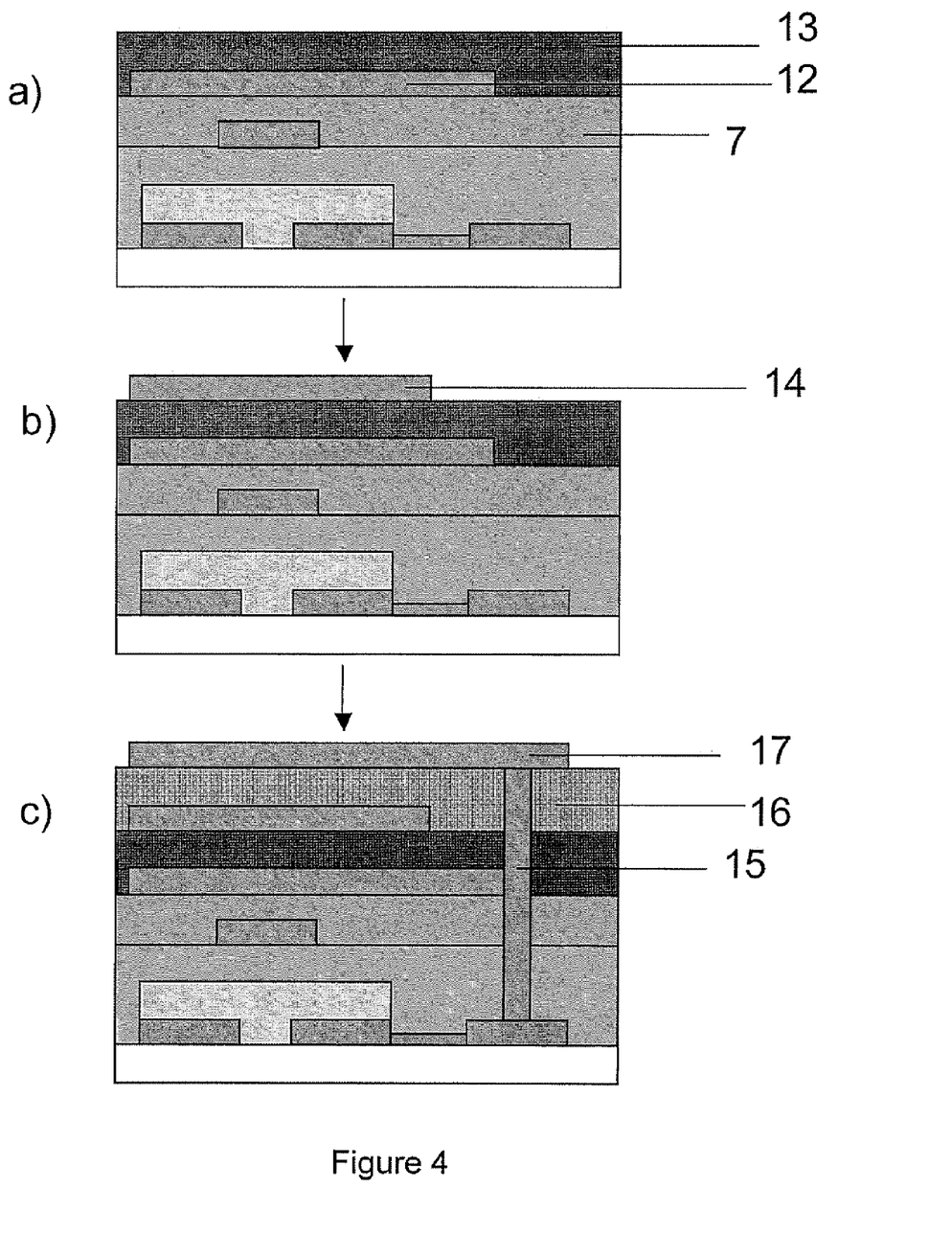
FIGS. 4a to 4c illustrate a method of forming a multi-layer transistor and capacitor structure including a via hole through a five level structure, connecting a top pixel electrode and a via pad on a lower level of the device, a cross-sectional view of a resulting structure.

A second embodiment of the present invention provides a five layer transistor device structure as is illustrated in FIG. 4. As described above, this structure incorporates an additional conductive layer as a capacitor layer and overlying dielectric material layer which allows a lower tolerance for the dielectric layer deposited above the COM layer, for example for thickness of the layer. The addition of both the dielectric layer above the capacitor level and the layer of dielectric material above the COM layer may be used in a capacitor structure where there is a requirement for the capacitance to be high. This five layer sandwich structure is advantageous as it allows a thicker top dielectric layer to be used and allows the patterning of the top pixel electrode to be achieved more readily and allows the possibility of higher $C_{storage}$ values.

With reference to FIG. 4 which continues to FIG. 2, a second embodiment of the present invention is now described. As stated above, the material of the second dielectric layer 7 may be deposited on top of the gate electrode from solution in the form of a continuous layer using techniques such as, but not limited to, spincasting, ink-jet printing, spray-coating, roller coating spray or blade coating. However, preferably, the technique of spray coating is used. The dielectric material may also be deposited using vapour phase deposition techniques like evaporation or chemical vapour deposition. As is described above for the first embodiment, and is referred to in our previous patent (WO01/47043), the material of the dielectric layer is preferably deposited in such a way so as to limit degradation to the underlying layers. If the second dielectric layer does not have a surface energy which allows for the deposition of the overlying organic conductive material, than an additional insulating wetting layer may be used to facilitate the deposition of the organic conductor. An example of this material that may be used for the wetting layer is polyvinylphenol.

A conductive material is then deposited over the second layer of dielectric material 7 to form the capacitor layer 12. In situations where the upper conductive layer or fifth conductive layer 17 (as described below), is adapted to allow top pixel patterning with the underlying pixel capacitor needing to be large in size, then the capacitor structure may be patterned as previously described, using processes such as, but not limited to, photolithography, laser ablation or direct-write printing. Other processes that may be used include shadow mask evaporation or other printing and etching methods. The capacitor electrode is deposited and patterned such that it will cover a significant proportion of the top pixel footprint as this provides half of a sandwich capacitor that will be formed between the capacitor layer, the COM layer and the top pixel layer.

The capacitor layer 12 is connected to the drain electrode via pad, either through a via hole which shorts the pixel layer, capacitor layer and the drain via pad together, as is described below. However, alternatively, there may be occasions as described previously, where the COM line may be deposited as a continuous line where the areas of the via on the COM line level have been oxidized by the laser ablation via formation process. In addition, if the COM layer is formed of a material that becomes insulating during via formation within the region of the via, and the material of the capacitor layer remains conductive during via formation, then the COM line could be deposited as a continuous layer. An example of a material that may be oxidized during via formation is a reactive material, such as Aluminum, within an oxidizing atmosphere. Only a single via is then required to connect the top pixel and the capacitor to the drain. In this case, there is no need to pattern the COM line, as the areas of the via on the COM line level are no longer conductive.

A third isolating layer 13 is then deposited on top of the capacitor layer 12. This dielectric layer will form the first dielectric layer of the storage capacitor. This layer 13 may be deposited using the same methods as discussed above for previous dielectric deposition. This dielectric layer acts as an isolation layer and, if the capacitor layer/COM layer overlap is the principle source of storage capacitance, then this layer should be thin in order to provide high storage capacitance.

The COM line 14 is then deposited and patterned on top of the dielectric layer 13, except for situations where oxidation of areas of the via has occurred during formation and a continuous COM line may then be produced requiring little patterning or alignment, as it discussed above. The potential of the COM line is of a separate potential to the capacitor pixel, and may be the same or different to the potential of the display media common electrode 11" (see FIG. 3).

A fourth dielectric layer 16 is then deposited on top of the COM line. This fourth dielectric layer forms the upper dielectric material of the storage capacitor. If the COM layer/top pixel overlap is required for the storage capacitor then the layer of dielectric material should be suitably thin, as with the third dielectric layer, or of a suitable dielectric constant. If the storage capacitance between the capacitor layer and the COM layer is sufficient, then this layer may simply be used as an isolation layer and the dielectric material can be tuned to allow the top pixel electrode to be patterned. A suitable material for the top pixel dielectric is polyvinylphenol doped with a non-conductive chemical moiety which absorbs at a suitable wavelength preferably of ~830 nm. This allows the dielectric layer with added chemical moiety to absorb the radiation and melt or ablate away, isolating the overlying PEDOT top pixel layer. Again, the adhesive properties of the dielectric and overlying materials are a consideration when choosing or tuning the dielectric material.

In a five layer device structure the capacitor layer is connected to the pixel electrode and the via pad on the source/drain level through a via-hole interconnection. If one via cannot connect all three layers, a separate connection between the capacitor layer and the drain may be formed prior to the deposition of the capacitor layer 12. Alternatively, the via between the capacitor and the via pad may form part of the main via 15 between the upper pixel electrode and the via-pad on the source-drain level. An electrical connection between two conductive electrodes is then formed. This can be achieved by filling the via-hole with a conductive material which forms an electrical connection to the annular ring of the capacitor layer exposed on the side wall of the via hole, formed during the laser ablation process. In a preferred embodiment of this aspect of the invention this is achieved by filling the via-hole by solution deposition of the conducting polymer into a via-hole generated by laser ablation.

Figure 5:
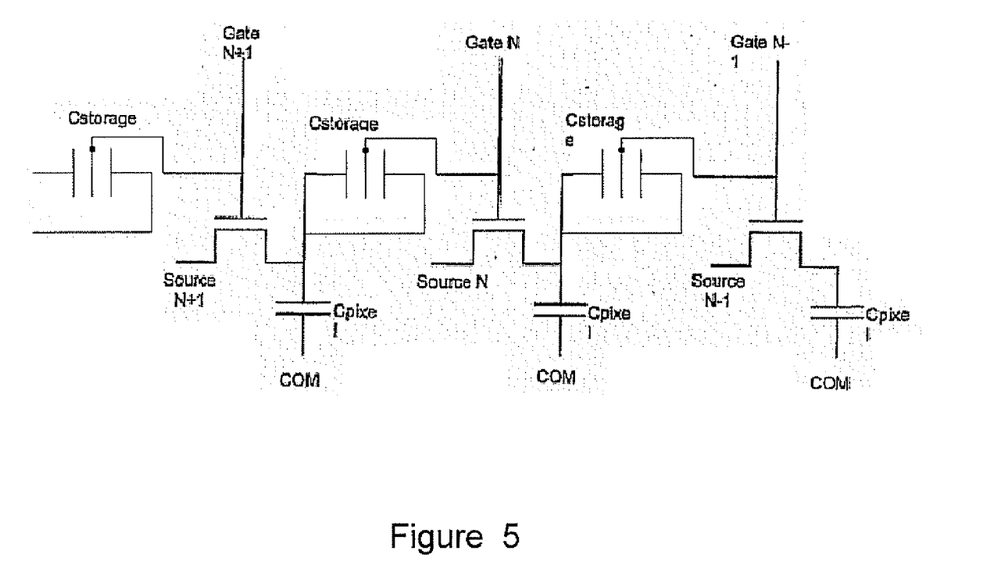
FIG. 5 shows a circuit of a pixel drive incorporating an embodiment of a capacitor structure according to the invention.

A circuit of a pixel driver incorporating the above described capacitor structure is shown in FIG. 5.

The main advantages of the aforementioned 5-layer structure, as described above, are that it reduces the processing and materials constraints on the 4-layer pixel dielectric 7. The sandwich capacitor structure allows a greater capacitance to be achieved, a lower specification of materials to be used and thicker layers, which may be easier to reliably process. The 5-layer structure also encompasses the advantages in terms of alignment tolerant designs and low alignment processing steps that are outlined for the 4-layer structure above.

The combination of materials and processes used to fabricate this invention are preferably tailored to the end use of the device. For a reflective display, there is no need for the active matrix backplane components to be transparent. However, for a transmissive display, one arrangement uses a combination of high conductivity, highly (spatially) confined opaque conducting materials with lower conductivity transparent conductors. The highly conducting, well confined materials, for example colloidal silver, which can be deposited in many ways including surface energy assisted printing or aerosol, are used as the data lines and interconnect lines. The confined nature of these features means that the transmission of the display is not seriously affected. The transparent, lower conductivity elements, for example ITO or PEDOT, which can also be deposited using printing or other methods, are used, for example, for the pixel and storage capacitance electrodes. This combination of high conductivity and high resolution patterned layers combined with low conductivity transparent layers enables the fabrication of a print based transparent display with high aperture ratio and high pixel capacitance.

The processes and devices described herein are not limited to devices fabricated with solution-processed polymers. Some of the conducting electrodes of the TFT and/or the connections in the display device may be formed from inorganic conductors that may, for example, be deposited by the printing of a colloidal suspension or by electroplating onto a pre-patterned substrate. In devices in where not all of the layers need to be deposited from solution, one or more PEDOT/PSS portions of the device may be replaced with an insoluble conductive material such as a vacuum-deposited conductor.

Any solution processable conjugated polymeric or oligomeric material that exhibits adequate field-effect mobilities exceeding $10^{-3}$ cm$^2$/Vs, preferably exceeding $10^{-2}$ cm$^2$/Vs, may be used for the formation of the semiconducting layer. Suitable materials are reviewed in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic semiconductor nanowires.

The electrodes may be coarse-patterned by techniques other than inkjet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, filexographic printing or other graphic arts printing techniques. Ink-jet printing is considered to be particularly suitable for large area patterning with good registration, in particular for flexible plastic substrates.

Other low-cost patterning techniques can also be used, such as subtractive patterning by photolithography or laser ablation patterning. A particularly preferred patterning technique is selective laser ablation patterning (SLAP) (as explained in patent application number GB0513915.9). The technique of SLAP is a method of producing fine features of a device using short pulse lasers for the fabrication of thin film transistor (TFT) structures. This technique incorporating laser ablation uses a single shot per imaging area of a short pulse laser to pattern layers of metallic material on top of underlying layers in order to produce fine features of a TFT device. An example is the patterning of a gold gate electrode of a top-gate organic TFT with underlying gate dielectric, active semiconductor and conducting source-drain electrode layers. This technique may be performed without destroying or substantially degrading the performance of these sensitive elements, such as the semiconductor layer and the source-drain electrodes. This is due to the short pulse length allowing all of the energy of an ultra-short laser beam to enter the material and to be absorbed within the layer to be ablated which will result in the act of ablation before any substantial thermalization actually occurs, that can lead to degradation/ablation of underlying layer. In addition, this technique may be used to finely tune the source and drain electrode formation after a coarser laser ablation process, resulting in the substantial elimination of burring edges that could lead to electrical shorts. In addition, this technique is able to be used to remove small areas of unwanted conductive material, for example, those that have been formed as a result of the production of debris. This technique can be employed for patterning of metal electrodes and interconnects on the various levels of the device, in particular for patterning of the source-drain and gate electrodes, and the common electrode layer.

Although preferably all layers and components of the device and circuit are deposited and patterned by solution processing and printing techniques, one or more components may also be deposited by vacuum deposition techniques and/or patterned by a photolithographic process.

The techniques described herein may, in the context of TFT fabrication, also be employed to pattern the source-drain layer of a bottom gate design. The processes described herein may also be used to form other components of such circuits, such as two-terminal devices, such as, but not limited to thin film diodes or amorphous silicon diodes.

The present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A pixel drive structure for an active matrix display including a multilayer electronic structure, the multilayer electronic structure including:
    a thin film transistor (TFT) for driving a pixel of said active matrix display and a capacitor for storing charge to maintain an electrical state of said active matrix pixel,
    wherein the multilayer electronic structure comprises
    a substrate bearing at least four conducting layers separated by at least three dielectric layers,
    first and second ones of said conducting layers defining drain/source electrodes and a gate electrode of said transistor respectively, and
    third and fourth ones of said conducting layers defining respective first and second plates of said capacitor,
    wherein said first and second plates of said capacitor and said gate electrode of said transistor are laterally positioned such that they overlap in a vertical direction,
    wherein an upper one of said conducting layers defines a pixel pad layer comprising a pixel pad connected to said first conducting layer of said thin film transistor for driving said pixel of said active matrix display;
    wherein said pixel pad forms said second plate of said capacitor,
    wherein said third conducting layer comprises said first plate of said capacitor which covers at least half the area of a pixel pad surface closest to the third conducting layer;
    wherein said third conducting layer is between said fourth conducting layer and said second conducting layer; and
    further wherein a channel region of said TFT comprises an organic semiconducting material.

2. A pixel drive structure as claimed in claim 1 further comprising a via connecting a said drain or source electrode to said second plate of said capacitor.

3. A pixel drive structure as claimed in claim 1 further comprising an additional conducting layer and an additional dielectric layer between said second conducting layer and said third conducting layer connected to form a third plate of said capacitor.

4. A pixel drive structure as claimed in claim 3 further comprising a via connecting a said drain or source electrode to said second plate of said capacitor, and wherein said additional conducting layer is connected to said via.

5. A pixel drive structure as claimed in claim 3 wherein a capacitance between said first and third plates of said capacitor is greater than a capacitance between said first and second plates of said capacitor.

6. A pixel drive structure as claimed in claim 1 wherein said first, second, third and fourth conducting layers are first, second, third and fourth in order of increasing distance from said substrate.

7. A pixel drive structure as claimed in claim 1 and wherein one or both of said third and fourth conducting layers comprise a layer of conducting material which is substantially transparent in a visible region of the spectrum.

8. A pixel drive structure as claimed in claim 1 wherein said substrate comprises a flexible substrate.

9. A pixel drive structure as claimed in claim 8 wherein said flexible substrate is a plastic substrate.

10. An active matrix display incorporating the pixel drive structure of claim 1.

11. A pixel drive structure is claimed in claim 1 wherein said third conducting layer defines a line having a linewidth smaller than a pixel pitch of said pixel drive structure and fully beneath said pixel pad.

12. A multilayer electronic structure, the structure including a thin film transistor (TFT) comprising a gate electrode in a first transistor conducting layer and a capacitor structure comprising:
    a substrate bearing a first conducting layer defining a first plate of said capacitor,
    a second conducting layer defining a second plate of said capacitor, and
    a first intermediate dielectric layer between said first and second capacitor plates; and
    wherein the structure further comprises:
        a third conducting layer defining a third plate of said capacitor which covers at least half the area of a surface of the second plate of said capacitor, which is closest to the third conducting layer, said second and third plates being on opposite sides of said first plate,
        a second intermediate dielectric layer between said first and third capacitor plates, and
        an interconnect connecting said second and third plates;
    wherein said third conducting layer is between said second conducting layer and said first transistor conducting layer;
    wherein said second and third plates of said capacitor overlap said gate electrode in a vertical direction;
    wherein said second plate of said capacitor is a pixel pad; and
    wherein a channel region of said TFT comprises an organic semiconducting material.

13. An active matrix display pixel structure including the capacitor structure of claim 12.

14. A multiple layer pixel structure for an active matrix display, the pixel structure defining:
    an organic thin film transistor and
    an associated capacitor on a substrate,
    wherein a first plate of said capacitor is defined in a first metal layer,
    wherein a gate electrode of said thin film transistor is defined in a second metal layer different to said first metal layer;
    wherein a second plate of said capacitor is defined in a third metal layer which comprises a pixel electrode;
    wherein said pixel electrode comprises said second plate and wherein said first plate covers at least half the area of a pixel electrode surface which is closest to the third metal layer;

wherein said first metal layer is between said second metal layer and said third metal layer;

wherein said first and second plates of said capacitor overlap said gate electrode in a vertical direction; and further wherein a channel region of said organic thin film transistor comprises an organic semiconducting material.

15. A pixel interface circuit for an active matrix optoelectronic device, the circuit including:

a thin film transistor configured to connect to an electrode for interfacing with an optoelectronic pixel of the device, the thin film transistor comprising a gate electrode in a first transistor conducting layer, and a capacitor coupled to said transistor for storing charge to maintain an interface signal for said electrode;

wherein said capacitor comprises:

three plates, a first plate being located between second and third plates of said capacitor, wherein said second plate is a pixel electrode, wherein said third plate covers at least half the area of a pixel electrode surface which is closest to the third plate; and wherein said second and third plates are connected together;

wherein said third plate is between said second plate and said first transistor conducting layer;

wherein said second and third plates of said capacitor overlap said gate electrode in a vertical direction; and further wherein a channel region of said thin film transistor comprises an organic semiconducting material.

* * * * *